Dec. 25, 1956

D. H. RING 2,775,700

FREQUENCY STABILIZED OSCILLATOR

Filed Oct. 1, 1953

INVENTOR
D. H. RING

BY A.J. Torsiglieri
ATTORNEY 2,775,700
Patented Dec. 25, 1956

2,775,700

FREQUENCY STABILIZED OSCILLATOR

Douglas H. Ring, Red Bank, N. J., assignor to Bell Telephone Laboratories, Incorporated, New York, N. Y., a corporation of New York Application October 1, 1953, Serial No. 383,619
5 Claims. (Cl. 250—36)

Figure 1:
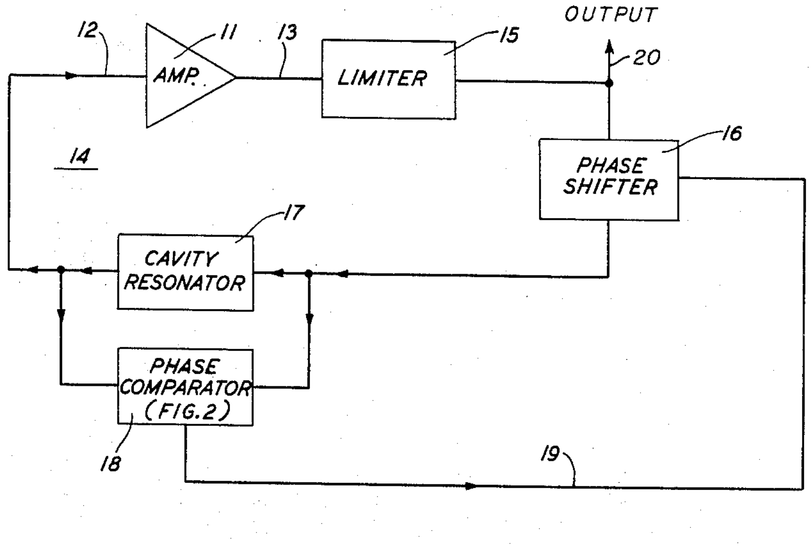

This invention relates to frequency stabilized oscillators for use at microwave frequencies.

In a copending application Serial No. 383,620, filed October 1, 1953, by J. R. Pierce, there is described a microwave frequency-stabilized oscillator which comprises an oscillatory loop including an amplifying element, such as a traveling wave tube, and a cavity resonator tuned to a desired frequency, a circuit for measuring the phase shift of the oscillatory wave in its traversal of the cavity resonator, and a servo-control system for utilizing this measure of the phase shift for varying the oscillatory frequency of the loop by modifying the electrical length of the amplifying element, whereby the oscillatory frequency is shifted towards the resonant frequency of the cavity resonator and the phase shift of the oscillatory wave across the resonator is minimized.

The present invention relates to improvements in a frequency stabilized oscillator of this kind. It is characteristic of oscillators of this kind that the amplifying element not only provides the gain necessary in the closed loop to sustain the oscillation but also serves to stabilize the oscillatory frequency by its changes in electrical length and to limit the amplitude of the oscillations as it overloads.

However, in many applications, it may be desirable to divorce the limiting, amplifying, and stabilizing functions of the amplifying element. For example, it may be preferable to operate the amplifying element in a linear gain region rather than in an overload condition and to employ a separate limiting element in the oscillatory loop. In this case, it may be advantageous to employ some other mechanism for modifying the electrical length of the loop. Moreover, even in the case where the amplifying element is operated in an overload condition for providing self-limiting action, when such an amplifying element is a traveling wave tube, the amplifying characteristics may to a considerable degree be dependent on the beam voltage at which the tube is operated. In such a case, variations of the beam voltage made to modify the electrical length of the tube for correcting the oscillatory frequency of the loop may concurrently modify the amplifying characteristics undesirably. Accordingly, in this case too, it is advantageous to incorporate in the oscillatory loop a separate element for varying the electrical length of the loop.

To this end, one improvement of the present invention is the inclusion, in the oscillatory loop of an oscillator substantially of the kind described, of a variable phase shifting element which is adjusted by the measure of the phase shift of the oscillatory wave through the cavity resonator to correct the oscillatory frequency. The inclusion of such a phase shifter provides a positive linear control of the electrical length of the oscillating loop which is independent of the parameters and operating conditions of the amplifying element so that these can be chosen for optimum operation as an amplifying element.

It can also be seen that the efficacy of the stabilization mechanism depends to a considerable extent on the sensitivity and stability of the phase comparison circuit which measures the phase shift of the oscillatory wave in passing through the cavity resonator. The more sensitive a phase comparator incorporated the greater the stability which can be achieved.

In a preferred embodiment of the invention there is included an improved form of microwave phase comparator for providing an output voltage which is a measure of the phase differences of two microwave samples taken from opposite sides of the cavity resonator in the oscillatory loop.

In this comparator a first microwave sample is applied to a frequency changer which may be of the continuous phase shifter type and which is under the control of a relatively low intermediate frequency source. The frequency changer alters the frequency of this first microwave sample by a fixed amount determined by the frequency of the intermediate frequency source. The altered sample and the second microwave sample are applied to a microwave converter and there is recovered therefrom an output sample of the same frequency as the intermediate frequency source which controls the frequency changer. It is characteristic that the relative phase of the intermediate frequency source and the intermediate frequency output of the microwave converter will be the same as the relative phase of the two microwave samples. Thus this intermediate frequency output sample and a sample from the intermediate frequency source may be compared in a conventional low frequency phase detector to derive a control voltage which is a measure of the phase difference of the two original microwave samples.

In a phase comparator of this kind, the phase detection is done at a relatively low intermediate frequency where more rugged and stable units can be provided than are presently available for use at microwave frequencies. Moreover, this phase comparator has the added advantage that the intermediate frequency signals can be amplified readily by simple amplifying arrangements so that a high level phase detector may be used. This avoids the need for high gain D. C. amplifiers for amplifying the control voltage and also tends to minimize the amount of power which needs to be abstracted from the oscillatory loop for frequency stabilizing purposes.

Figure 2:
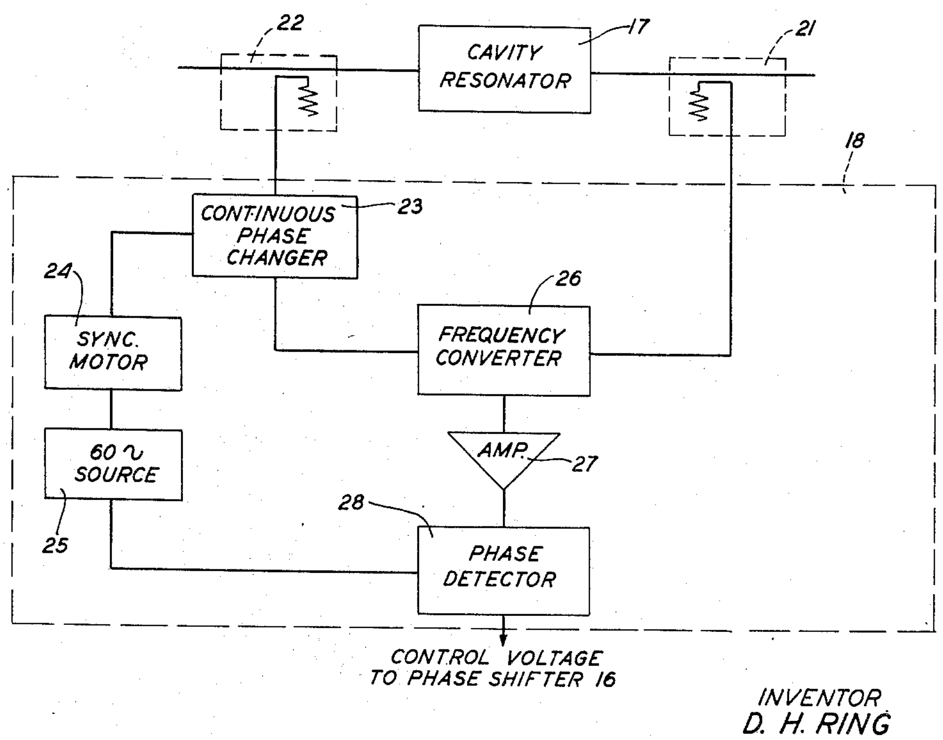

The invention will be better understood from the following more detailed description taken in conjunction with the accompanying drawings in which:

Fig. 1 shows in block schematic form a frequency stabilized oscillator in accordance with the invention, and Fig. 2 shows the phase comparator portion of the frequency stabilized oscillator shown in Fig. 1 expanded to show the details of a phase comparator suitable for use in a preferred form of the invention.

With particular reference now to Fig. 1, a microwave amplifying element 11, such as a traveling wave tube, having input and output terminals 12 and 13, respectively, has a regenerative feedback circuit connected therebetween for forming a closed loop 14. Serially connected in the loop are also an amplitude limiting element 15, a variable phase shifting element 16, and a high-Q cavity resonator 17 which is tuned to the frequency desired for oscillations. Wave guides of rectangular cross section are advantageously used for the various interconnections but for simplicity these are shown as single lines. Such a loop will oscillate at frequencies for which the gain around the loop is initially greater than unity and at which the electrical length of the loop is an integral number of wavelengths. A phase comparator 18 is provided with samples of the oscillatory wave at regions before and after its traversal of the resonator 17. As is well known, the phase shift of the oscillatory wave across the resonator is a measure of the deviation of the oscillatory frequency from the resonant frequency of the resonator. The phase comparator provides a control voltage which is a measure of any such phase shift and this control voltage is used by a control circuit 19 to adjust the effective electrical length of the variable phase shifter 16 to modify thereby the oscillatory frequency of the loop in a direction to minimize any such phase shift. Additionally, a suitable output coupling connection 20 is provided for abstracting oscillatory energy from the loop for transmission to utilization apparatus.

All of the various elements forming the oscillatory loop are known to workers in the art and each may take a wide variety of forms. It will be helpful to discuss briefly by way of example at least one suitable form of each.

First, the amplifying element 11 is of the kind known to produce high gains at microwave frequencies, such as a multi-cavity klystron or traveling wave tube.

The limiter 15 similarly may take a wide variety of forms. One which is suitable is described in U. S. Patent 2,652,540, issued September 15, 1953, to A. F. Dietrich, which comprises a hybrid junction having four arms such that energy supplied from a source to a first arm is divided between two other arms with none transmitted directly to the fourth arm. By terminating said two other arms in crystals chosen to provide substantially complete reflection at relatively low levels of incident wave energy, at such low levels the energy supplied by the source will appear almost completely after reflection at the fourth arm. Then, by operating the crystals so that with increasing levels of incident wave energy supplied from the source, their impedance varies in a manner to reflect a correspondingly smaller proportion of the incident wave energy but substantially the same absolute amount to the fourth arm, the energy available at the fourth arm may be kept relatively constant. Accordingly, if such a hybrid junction is inserted in the oscillatory loop so that the oscillatory wave is applied as an input to the first arm of the hybrid junction while the fourth arm forms a continuation of the oscillatory loop, the desired limiting action can be achieved. As mentioned above, the use of a separate limiter in this way permits operation of the amplifying element 11 in a linear region of gain. Alternatively, a separate limiter may be avoided by making the amplifying element 11 self-limiting by operation in an overloaded condition. In such operation, the level of the oscillations continues to grow until the amplifying element is in an overloaded condition at which point self-limiting results. Such operation is still within the scope of the present invention.

The variable phase shifter 16 also may take various forms. Where relatively low speed variations are sufficient, a variable phase shifter of the kind described in the Proceedings of the I. R. E., December 1947, pages 1489 through 1498, in an article entitled "An adjustable wave-guide phase changer" by A. G. Fox, may be utilized. Such a phase shifter generally consists of five parts: a tapered section to convert from a rectangular wave guide to a circular wave guide; a 90-degree phase-shift section that converts the linearly polarized energy to circularly polarized energy; a 180-degree phase-shift section which reverses the direction of rotation of the circularly polarized energy from the 90-degree phase-shift section; a 90-degree phase-shift section for reconverting the circularly polarized energy to linearly polarized energy; and a tapered section for converting from a circular wave guide back to a rectangular wave guide. For varying the phase shift to be provided, the 180-degree phase-shift section is rotated by suitable mechanical means. For use in the practice of the invention, the control voltage developed by the phase comparison circuit can be used to drive a reversible motor for providing the necessary rotation.

Alternatively, where rapid variations in the phase shift to be introduced into the oscillatory loop are desired, there may be incorporated a variable phase shifter of the kind described in copending application Serial No. 362,193, filed June 17, 1953, by S. E. Miller. In such a phase shifter, vanes of ferromagnetic material are inserted in a rectangular wave guide parallel to and spaced from the narrow walls of the guide. The vanes are magnetized along a direction parallel to the narrow walls of the guide. The phase shift introduced by such a wave guide section depends upon the length of the vanes in the direction of propagation and the intensity of the magnetizing flux. Accordingly, the amount of phase shift introduced can be conveniently adjusted by varying the current in the magnetizing coils providing the magnetic flux in the vanes. For use in the practice of the present invention, the magnetizing current can be controlled by the control voltage derived from any detected phase shift across the cavity resonator.

The cavity resonator 17 also may take a wide variety of forms. Inasmuch as the resonant frequency of the cavity resonator serves as a reference frequency for stabilizing the oscillatory frequency, it is important that the resonant frequency should be as stable as practical. To obtain independence from the changes of atmospheric dielectric constant, the cavity may be hermetically sealed. To obtain independence from temperature changes, either temperature compensation or temperature regulation may be adopted. Moreover, since the sensitivity of the control is related to the Q of the cavity resonator, as high a Q as practical should be sought.

A phase comparator 18 of the kind for incorporation in a preferred embodiment is shown in greater detail in Fig. 2. With reference thereto, the phase comparison circuit first includes two directional couplers 21 and 22 coupled along opposite regions of the cavity resonator 17 for sampling the oscillatory wave previous and subsequent to traversal of the cavity resonator. The use of directional couplers for this purpose, although not necessary to the basic principles of this phase comparator, does have the advantage that they permit the convenient abstraction into branch paths of energy from the oscillatory loop without loading the oscillatory loop excessively. The energy abstracted by one of the directional couplers, for example coupler 22, is then applied to a phase shifter 23 of the kind described in the A. G. Fox article to which reference has been made above. A well-known characteristic of such a phase shifter is that it can be operated as a frequency changer by continuously rotating the 180-degree phase-shift section intermediate between the two 90-degree phase-shift sections. In particular, the change in frequency of the input signal will be twice the rotational speed and will increase or decrease the input signal frequency depending on the direction of rotation. Accordingly, if the rotation of the 180-degree phase-shift section of the phase shifter 23 is provided by a synchronous motor 24 driven by a sixty cycle signal from a source 25 to have 1800 revolutions per minute, there can be provided a new microwave signal whose frequency differs by sixty cycles from that of the oscillatory wave of the loop. Moreover, it is found characteristic of this frequency change that relative phase changes in the input microwave signal are carried over into the new microwave signal. This new signal is then applied as one input to a microwave frequency converter 26, the other input of which is the microwave sample derived by the coupler 21. The two signals are mixed, and the modulation product which is selected for further utilization is a sixty cycle signal corresponding to that supplied by the source 25. Many suitable forms of microwave converters are known for this purpose. For example, appropriate converters are described in Section 12.4, pages 637 through 645 of a book entitled "Principles and Application of Wave-guide Transmission" by G. C. Southworth, published by D. Van Nostrand Company, Inc., New York (1950). This sixty cycle signal is amplified in the audio frequency amplifier 27 and then is applied as one input to a low frequency phase detector 28 to which is also applied as an input a sixty cycle signal from the source 25 driving the synchronous motor 24. If the two signals applied to the phase detector 28 are adjusted initially to be in phase quadrature for providing a zero output when the oscillatory frequency corresponds to the resonant frequency of the cavity resonator, deviation of the oscillatory frequency from such resonant frequency, which produces relative phase changes in the two samples abstracted from the oscillatory loop by the directional couplers 21 and 22, will product corresponding relative phase changes in the two signals applied to phase detector 28. Accordingly, the resulting output voltage provided by phase detector 28 serves as a measure of the frequency deviation of the oscillatory wave and can be utilized as a control voltage for the control circuit in the oscillator shown in Fig. 1. To this end, the output voltage of the phase detector 28 is used to adjust the variable phase shifter 16 so that the oscillatory frequency more closely approaches the resonant frequency of the resonator. A suitable low frequency phase detector for this purpose is described in an article in Electronics, October 1949, entitled "Measuring phase at audio and ultrasonic frequencies" by E. R. Kretzmer.

A phase comparison circuit of the kind described may be modified to permit the phase detector 28 to operate at somewhat higher frequencies by the substitution of an electronic frequency changer which makes possible larger frequency changes than the electro-mechanical changer described. A suitable electronic frequency changer is described in copending application Serial No. 304,609 filed August 15, 1952, by A. G. Fox. Such an electronic frequency changer includes five parts: a first tapered section for converting from a rectangular wave guide to a circular wave guide; a second 90-degree phase-shift section for converting linearly polarized energy to circularly polarized energy; a third 180-degree differential phase-shift element which includes ferrite elements to which are applied a rotating magnetic field provided by currents through a magnetizing coil, a fourth 90-degree phase-shift section for converting circularly polarized energy to linearly polarized energy; and a final tapered section for changing from a circular wave guide to a tapered wave guide. In this case, the frequency change is related to the frequency of the rotating magnetic field, which in turn is controlled by the frequency of the magnetizing currents. In a phase comparator utilizing a frequency changer of this kind, the control voltage is derived in a manner completely analogous to that described above. A phase detector similar to phase detector 28 is utilized to measure the relative phase changes between a signal supplied from the intermedate frequency source supplying the magnetizing currents to the frequency changer and a signal of identical frequency derived as the modulation product from a microwave frequency converter to which have been supplied the microwave sample of oscillatory frequency of the loop and the microwave output of the frequency changer.

It should be evident at this point that the control voltage derived by a phase comparator of the kind described is not limited to the control of a variable phase shifter in the oscillatory loop as illustrated in Fig. 1 but can also be employed to vary the electrical length of any other suitable element in the oscillatory loop. For example, there may be controlled instead thereby the amplifying element in the manner characteristic of the oscillator described in the aforementioned copending Pierce application.

What is claimed is:

1. In combination, an amplifying element having input and output terminals, means forming a regenerative feedback path between said output and input terminals for forming with said amplifying element a closed oscillatory loop including serially connected a variable phase shifter and a high-Q cavity resonator which is tuned to a desired frequency of oscillation, means connected on opposite sides of the cavity resonator for deriving a measure of the phase shift of the oscillatory wave in said loop through said cavity resonator, and means for utilizing said measure to vary the phase shifter for reducing the deviation of the oscillatory frequency from the resonant frequency of the cavity resonator.

2. In combination, an amplifying element having input and output terminals, means forming a regenerative feedback path between said output and input terminals for forming with said amplifying element a closed oscillatory loop including a variable phase shifter, a limiter, and a high-Q cavity resonator which is tuned to a desired frequency of oscillation, means connected on opposite sides of the cavity resonator for deriving a measure of the phase shift of the oscillatory wave in said loop in its travel through said cavity resonator, and means for utilizing said measure to vary the phase shifter for minimizing the deviation between the oscillatory frequency and the resonant frequency of the cavity resonator.

3. In combination, an amplifying element having input and output terminals, means forming a regenerative feedback path between said output and input terminals for forming with said amplifying element a closed oscillatory loop including serially connected, a variable phase shifter and a high-Q cavity resonator, a phase comparator for measuring the relative phases of the oscillatory wave on opposite terminals of said cavity resonator comprising an intermediate frequency source, a frequency changer under the control of said source and supplied with a sample of the oscillatory wave at one terminal of said cavity resonator, a frequency converter supplied with the output of said frequency changer and a sample of the oscillatory wave at the other terminal of said cavity resonator, and a phase detector supplied with the output of said frequency converter and a sample from said source for providing a control voltage which is a measure of the relative phases of the oscillatory wave at the two terminals of the cavity resonator, and means for utilizing said control voltage for adjusting the variable phase shifter for minimizing the deviation of the oscillatory frequency from the resonant frequency of the cavity resonator.

4. In combination, an amplifying element having input and output terminals, means forming a regenerative feedback path between said output and input terminals including a variable phase shifter and a resonator element serially coupled to each other and to said amplifying element for high frequency wave energy flow for forming with said amplifying element a closed oscillatory loop, phase comparing means having two input terminals and an output terminal, the two input terminals being coupled for high frequency wave energy flow to opposite sides of the resonator element for deriving a measure of the phase shift of the oscillatory wave in its travel through said resonator element, and means coupled to the output terminal of said phase comparing means for utilizing said measure to adjust the variable phase shifter for varying the frequency of the oscillatory wave.

5. In combination, an amplifying element having input and output terminals, means forming a regenerative feedback path between said output and input terminals including a variable phase shifter, a limiter, and a resonator element serially coupled to each other and to said amplifying element for high frequency wave energy flow for forming with said amplifying element a closed oscillatory loop, phase comparing means having two input terminals and an output terminal, the two input terminals being coupled for high frequency wave energy flow to opposite sides of the resonator element for deriving a measure of the phase shift of the oscillatory wave in its travel through said resonator element, and means coupled to the output terminal of said phase comparing means for utilizing said measure to adjust the variable phase shifter for varying the frequency of the oscillatory wave.

References Cited in the file of this patent

UNITED STATES PATENTS

| | | |
|---|---|---|
| 2,462,294 | Thompson | Feb. 22, 1949 |
| 2,475,074 | Bradley et al. | July 5, 1949 |
| 2,581,594 | MacSorley | Jan. 8, 1952 |
| 2,584,608 | Norton | Feb. 5, 1952 |
| 2,672,557 | Norton | Mar. 16, 1954 |